United States Patent
Tagami

(10) Patent No.: US 6,659,004 B2
(45) Date of Patent: Dec. 9, 2003

(54) SCREEN PRINTING PASTE, SCREEN PRINTING METHOD, AND BAKED THICK FILM BODY

(75) Inventor: Mika Tagami, Yasu-gun (JP)

(73) Assignee: Murata Manufacturing Co. Ltd (JP)

( * ) Notice: Subject to any disclaimer, the term of this patent is extended or adjusted under 35 U.S.C. 154(b) by 0 days.

(21) Appl. No.: 09/906,174

(22) Filed: Jul. 16, 2001

(65) Prior Publication Data
US 2002/0029704 A1 Mar. 14, 2002

(30) Foreign Application Priority Data
Jul. 21, 2000 (JP) ........................................ 2000-220184

(51) Int. Cl.$^7$ ............................................... B41M 1/12
(52) U.S. Cl. ..................... 101/129; 101/491; 106/31.65
(58) Field of Search ................................ 101/114, 127, 101/128.4, 129, 491; 106/31.6, 31.65, 31.9; 523/160, 161

(56) References Cited

U.S. PATENT DOCUMENTS

| 5,361,695 A | * | 11/1994 | Takagi et al. ............... 101/127 |
| 5,448,948 A | * | 9/1995 | Somers et al. ............... 101/114 |
| 5,645,765 A | * | 7/1997 | Asada et al. ................. 252/518 |
| 5,688,441 A | * | 11/1997 | Itagaki et al. ................ 252/514 |
| 5,741,836 A | * | 4/1998 | Krenceski et al. ............ 524/44 |
| 6,066,271 A | * | 5/2000 | Hormadaly ............... 252/521.2 |
| 6,194,124 B1 | * | 2/2001 | Choi et al. ................. 430/287.1 |
| 6,322,620 B1 | * | 11/2001 | Xiao ........................ 106/31.92 |

FOREIGN PATENT DOCUMENTS

| JP | 06-139815 | 5/1994 |
| JP | 09-265833 | 10/1997 |
| JP | 09-286955 | 11/1997 |

* cited by examiner

Primary Examiner—Stephen R. Funk
(74) Attorney, Agent, or Firm—Dickstein, Shapiro, Morin & Oshinsky, LLP.

(57) ABSTRACT

A screen printing paste from which a fine pattern can be formed precisely is provided by setting the viscosity at a shear rate of 4 sec$^{-1}$ to be not less than about 40 Pa·sec and the viscosity at a shear rate of 10 sec$^{-1}$ to be not more than about 210 Pa·sec. It is preferable that the average particle diameter ($D_{50}$) of solid components contained in the paste be less than about 10 μm. It is also preferable that the flowability of the paste be not more than about 0.011 rad when a stress of 10 Pa is applied to the paste for two minutes. A screen printing method using the paste and a baked thick film body formed with the paste are also provided.

9 Claims, 2 Drawing Sheets

SCREEN PRINTING PASTE, SCREEN PRINTING METHOD, AND BAKED THICK FILM BODY

BACKGROUND OF THE INVENTION

1. Field of the Invention

The present invention relates to a screen printing paste. More particularly, the present invention relates to a paste for forming a pattern in order to make it possible to form a pattern such as a via hole or a line of electronic parts with a high precision by a screen printing method, to a screen printing method using the paste, and to a baked thick film body therefrom.

2. Description of the Related Art

In recent years, thick-film technologies (thick-film forming technologies) are widely applied to forming conductor circuits, protective films, insulating layers, etc. of electronic parts, wherein at least one type of inorganic powder as a solid component is dispersed in an organic vehicle to form a paste (screen printing paste), and a pattern is formed using the paste by screen printing, followed by baking to form a circuit or the like.

As progress in electronic parts for miniaturization and higher precision has been made in recent years, development for a technology has been required for a high precision pattern forming method according to this thick-film technology so as to form a fine pattern.

It is noted that precision in printing is a factor which exerts the greatest influence on the ultimate pattern precision when the pattern is formed by the thick-film technology. When a common paste is used for printing a fine pattern, there are some cases in which short-circuiting and line breakage occur on the line sections of the pattern, and via holes, etc. cannot be formed owing to blurring, thin and incomplete printing, sagging, etc. Accordingly, it is difficult to print a fine pattern precisely, and the present technology sometimes fails to meet the progress in miniaturization and higher precision for electronic parts required in recent years.

When a paste with an increased viscosity is used which is obtained by modifying the rate of the solid components in the paste or by employing other methods, the blurring and the sagging can be prevented. However, line breakage occurs more often, and it is difficult to print a fine pattern precisely.

The above-described "blurring" refers to the phenomenon where a paste spreads out in the course of the step for filling the paste into screen openings and the step for releasing the screen printing plate (paste transferring step). This "blurring" mainly affects the printing precision immediately after printing (that is, just after the squeegee has been run). Accordingly, it is possible to evaluate it by observing a printed matter under microscope immediately after printing.

"Thin and incomplete printing" refers to the state that the region to which a paste has been transferred and the region to which the paste has not been transferred exist together, as a result of insufficient supply and filling of the paste.

Furthermore, "sagging" is the phenomenon that a paste which has been transferred slowly spreads out by the influence of gravity after the screen printing plate has been released. Accordingly, it is possible to evaluate it by observing a printed matter under microscope after printing.

As described above, it is considered important to control the viscosity characteristics of a paste in order to precisely print a fine pattern. Thus, evaluation of the viscosity at a specific shearing speed has been carried out conventionally. However, the shearing speed applied to a paste varies greatly during the various printing steps such as rolling, filling, paste transferring and plate releasing, and the viscosity of the paste changes greatly as the shearing speed varies. Therefore, it is not possible to fully evaluate the printability by measuring the viscosity at a specific shearing speed (i.e., one shearing speed alone), as has been conducted conventionally, and the relationship between the printability and the viscosity has not been fully elucidated.

Under these circumstances, the viscosity control has been carried out conventionally through a trial-and-error approach based on experience. However, it has been becoming difficult to filly meet the requirement of finer print which has been required in recent years by using only such experience.

SUMMARY OF THE INVENTION

One of the objects of the present invention is to solve such problems as described above and to provide a screen printing paste with which a fine pattern can be formed precisely, a screen printing method using the screen printing paste, and a baked thick film body formed by using the screen printing paste.

For achieving the above-described objects, various investigations and experiments have been conducted to find the viscosity characteristics for a paste with which a fine pattern could be formed precisely, and as a result, it was found that it was possible to obtain a paste for forming a fine pattern by controlling the viscosities of the paste at least at two different shear rates. The present invention has been accordingly accomplished by further conducting investigations and experiments.

Accordingly, a screen printing paste according to the present invention is characterized in that it has a viscosity of not less than about 40 Pa·sec at a shear rate of 4 $\sec^{-1}$ and a viscosity of not more than about 210 Pa·sec at a shear rate of 10 $\sec^{-1}$.

Since the screen printing paste according to the present invention has a viscosity of not less than about 40 Pa·sec at a shear rate of 4 $\sec^{-1}$, it is possible to secure reliable print without generating blurring of the paste or permitting the paste to reach the rear of the screen printing plate during the step of paste filling/transferring in the course of screen printing, thus without causing short-circuiting of fine lines.

Furthermore, since the screen printing paste according to the present invention has a viscosity of not more than about 210 Pa·sec at a shear rate of 10 $\sec^{-1}$, good flowability is secured for the paste during the paste transferring, with the result that good printing is secured without causing line breakage even when a fine line is formed by screen printing. A denser pattern is made possible accordingly.

It is noted that the screen printing paste according to the present invention is particularly favorably used for forming a printed pattern containing a line pattern with a line width of not more than about 100 μm. It is also possible to precisely form a printed pattern containing a line pattern with a line width of not more than about 75 μm, or even with a line width of not more than about 50 μm, by also controlling other conditions.

Furthermore, the solid components which are contained in the screen printing paste according to the present invention preferably have an average particle diameter ($D_{50}$) of less than about 10 μm.

When the average particle diameter ($D_{50}$) of the contained solid components is less than about 10 μm, it is possible to improve the characteristics for filling the paste into the screen openings, thus preventing line breakage which is related to the size of solid components, and making it possible to precisely print a fine pattern.

Furthermore, the screen printing paste according to the present invention is preferably characterized in that the flowability amount of the paste is not less than about 0 rad and not more than about 0.011 rad when a stress of 10 Pa is applied to the paste for two minutes.

By setting the flowability amount of the paste to be not less than about 0 rad and not more than about 0.011 rad when a stress of 10 Pa is applied to the paste for two minutes, it is possible to restrict blurring due to sagging of the paste and to print a pattern precisely according to the plan. Furthermore, it is possible to prevent lines from short-circuiting due to sagging when the paste has such viscosity characteristics.

It is noted that the above-described flowability amount is a value determined by using a RHEOMETER CSL100 manufactured by Carri-Med, Inc. and a 2 cm long×1° cone, and is defined as the rotational angle of the cone when a stress of 10 Pa is applied to the paste using the apparatus for two minutes.

Furthermore, a screen printing method according to the present invention is characterized in that a printed pattern having a specific shape is formed by subjecting the screen printing paste to printing on a subject to be printed using a screen printing plate.

By performing screen printing using a screen printing paste according to the present invention, it is possible to form a fine printed pattern with an excellent shape precision.

Furthermore, in the screen printing method according to the present invention, the above-described printed pattern preferably contains a line pattern with a line width of not more than about 100 μm.

By performing screen printing using a screen printing paste according to the present invention, a printed pattern containing a fine line pattern with a line width of not more than about 100 μm can be formed precisely and without fail, which has not been necessarily easy when a conventional screen printing paste is used.

Furthermore, a baked thick film body according to the present invention is characterized in that it is a baked thick film body having a line made of a thick film with a line width of not more than about 100 μm, and the body is formed by baking a printed pattern obtained by subjecting a screen printing paste according to the present invention to screen printing.

The baked thick film body according to the present invention is formed by baking a printed pattern formed by using a screen printing paste according to the present invention. Accordingly, it is possible to form it with a high level of shape precision when it has a fine line with a line width of not more than about 100 μm.

DESCRIPTION OF THE PREFERRED EMBODIMENTS

Various printing defects have been investigated which occurred when a fine pattern was printed with a conventional paste, and they were classified into the following three modes:

(1) blurring during the step of paste filling/transferring;
(2) line breakage due to insufficient filling; and
(3) spreading (blurring) of a paste due to sagging after printing.

Then the viscosity characteristics were elucidated which were required for solving each printing defect. Accordingly, the present invention has been accomplished by improving the viscosity characteristics of the paste. The following are detailed explanations.

Although the present invention is described with reference to the following figures and examples, it is to be understood that the invention is not limited to the precise embodiments described below.

Blurring at the Step of Paste Filling/Transferring

Since the above-described blurring (1) is generated at the step of paste filling/transferring, it has been generally believed that the viscosity at a high shear rate region plays an important role. However, there have been only few instances in which the viscosity behavior was investigated from this viewpoint and it has not been fully clarified what shear rate is important for the viscosity behavior. Therefore, in the course of investigations for accomplishing the present invention, screen printing pastes having various viscosity characteristics were prepared by changing the type of the solid components, the blending ratio of the solid components, the blending amounts of the resins and solvents, etc. so as to clarify the viscosity characteristics influencing the printability.

The contributions of the viscosity characteristics of a paste were obtained by measuring the line width immediately after printing (amount of blurring), since the degree of blurring can be evaluated by the amount of blurring generated immediately after printing.

Figure 1:
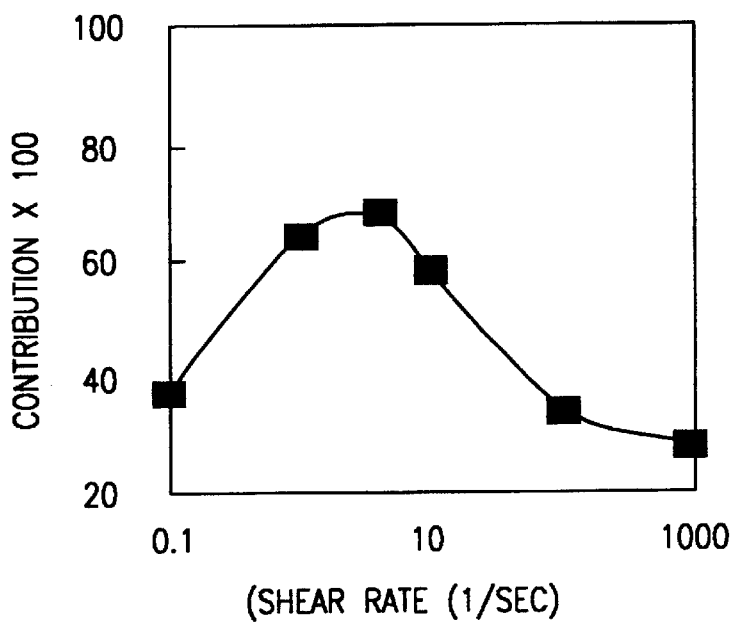
FIG. 1 shows the contribution of viscosity characteristics (viscosities at various shear rates) to the amount of blurring at the step of paste filling/transferring of a screen printing paste according to an embodiment of the present invention.
Figure 2:
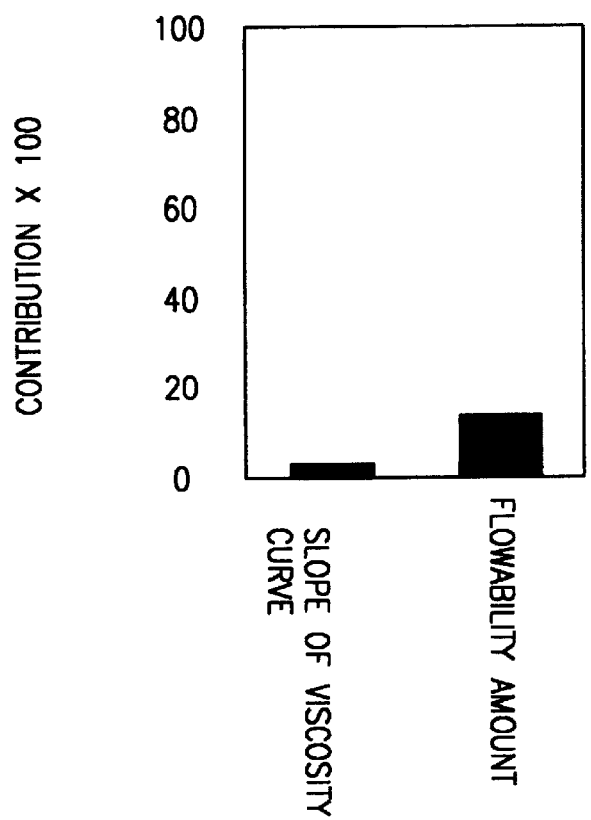
FIG. 2 shows the contribution of viscosity characteristics (slope of the viscosity curve and flowability amount) to the amount of blurring at the step of paste filling/transferring of a screen printing paste according to an embodiment of the present invention.

As a result, the contributions of the viscosity characteristics of a paste to the blurring were as shown in FIGS. 1 and 2, and it was found that the blurring at the step of paste filling/transferring can be evaluated by the viscosity at the shear rate of 4 sec$^{-1}$.

As the viscosity characteristics of a paste, the viscosity at each shear rate, the slope of a shear rate vs. viscosity graph (viscosity curve), and the flowability amount of the paste kept under a stress of 10 Pa have been selected. As the slope of shear rate vs. viscosity graph (viscosity curve), the coefficient C of the formula of Sisco: (viscosity)=$A$ 30 $B\times$(shear rate)$^C$ is used for approximating the shear rate-viscosity graph is used.

The flowability amount of a paste kept under a stress of 10 Pa was determined using a RHEOMETER CSL100 manufactured by Carri-Med, Inc. and a 2 cm long×1° cone, and was defined as the rotational angle of the cone when a stress of 10 Pa was applied to the paste for two minutes.

Furthermore, when the printability was evaluated by the line width of a 50 μm-wide line immediately after printing, it was found that the lower was the viscosity at a shear rate of 4 sec$^{-1}$, the more often the incidence of overfilling of the paste into a pattern opening occurred, and the more often the incidence of blurring at the paste transferring step occurred. Owing to this tendency, blurring occurred even immediately after printing and a fine pattern could not be printed precisely when a paste was used which had a viscosity of less than about 40 Paxsec at a shear rate of 4 sec$^{-1}$.

Line Breakage Due to Insufficient Filling

When a fine pattern is printed, it is important to prevent the line breakage due to the above-described insufficient filling (2) as well as to prevent the problem of the above-described insufficient printing (1).

Regarding this line breakage, the correlation between the viscosity characteristics and the occurrence of line breakage of 50 μm-wide lines was investigated using pastes having various viscosity characteristics. As a result, it was found that the generation of line breakage could be evaluated by the viscosity at a shear rate of 10 sec$^{-1}$.

As the viscosity at a shear rate of 10 sec$^{-1}$ is raised, the flowability of the paste is worsened and a sufficient amount of the paste cannot be supplied to the rear side of the screen mesh of the screen printing plate at the time of filling, with a result that line breakage is generated and a fine pattern cannot be printed precisely.

The average particle diameter of the solid components used for a screen printing paste according to the present invention affects line breakage. When the average particle diameter ($D_{50}$) of the solid components is not more than about 5 μm, the influence is small. However, when the average particle diameter ($D_{50}$) is not less than about 10 mm, line breakage would occur even if the paste has a low viscosity. Therefore, the average particle diameter ($D_{50}$) of the solid components contained in the paste is preferably less than about 10 μm. More preferably, it is not more than about 5 μm.

It is noted here, that there is no particular limitation of the type and blending ratio of the solid components, the type and amount of resins, the amount of solvents, etc. used for a paste according to the present invention. That is, the amount of blurring at the step of paste filling/transferring and the generation of line breakage due to insufficient filling do not depend on the constitution of the paste other than the particle diameters of the solid components, and can be determined by the viscosity characteristics alone. Examples of the solid components according to the present invention include an inorganic powder such as a metal powder, a glass powder and a ceramic powder, as well as an organic resin powder which is insoluble in the solvents.

Spreading (Blurring) of a Paste Due to Sagging After Printing

Regarding the spreading (blurring) of a paste due to the above-described sagging after printing (3), pastes having various viscosity characteristics were prepared and the relationship with the viscosity characteristics was investigated.

Figure 3:
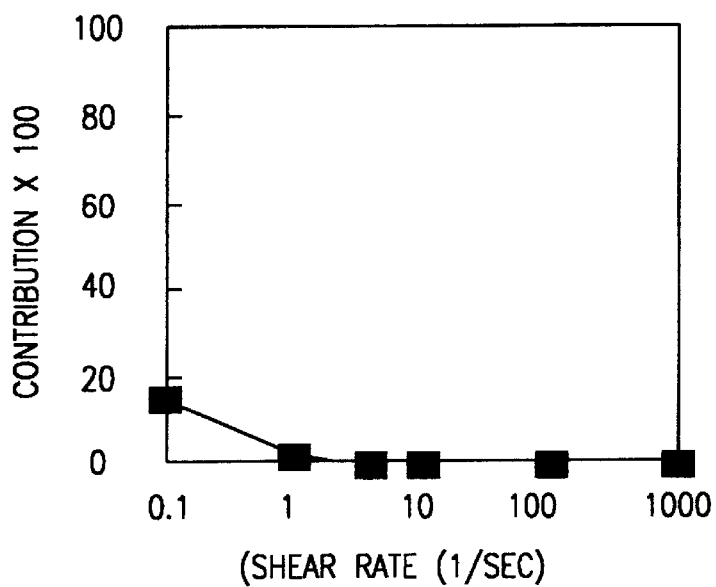
FIG. 3 shows the contribution of viscosity characteristics (viscosities at various shear rates) to the amount of blurring due to sagging after printing using a screen printing paste according to an embodiment of the present invention.
Figure 4:
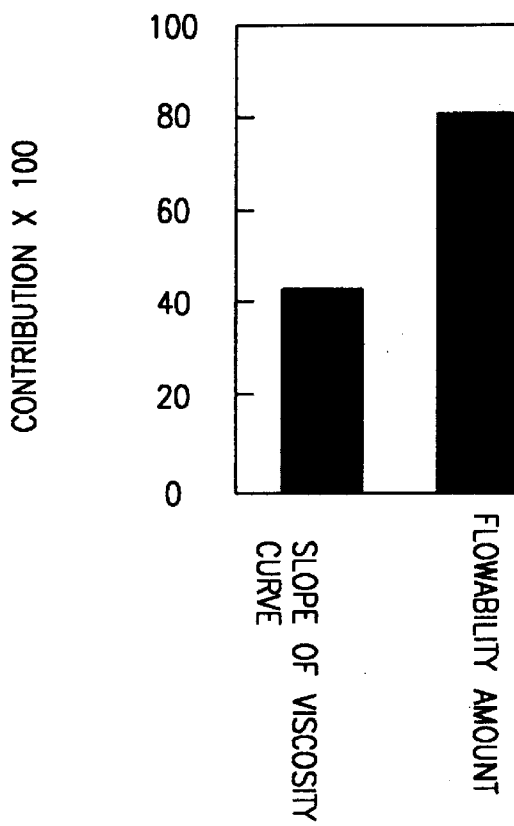
FIG. 4 shows the contribution of viscosity characteristics (slope of the viscosity curve and flowability amount) to the amount of blurring due to sagging after printing using a screen printing paste according to an embodiment of the present invention.

The relationship between the amount of sagging (the amount of line spreading from the point of immediately after printing to the point of three minutes after printing) for a 50 μm-wide line, and the viscosity characteristics was investigated from the viewpoint of the contributions of the viscosity characteristics to the amount of sagging. From the results shown in FIGS. 3 and 4, it was found that the amount of sagging could be evaluated by the flowability amount when a stress of 10 Pa was applied to the paste for two minutes.

The flowability amount of a paste kept under a stress of 10 Pa represents an amount of deformation due to the gravitation of the paste. The larger is the flowability amount, the larger is the amount of deformation by the gravitation. That is, if a paste has a flowability amount of more than about 0.011 rad when a stress of 10 Pa is applied to the paste for two minutes, a larger amount of sagging after printing is obtained and it is difficult to have a good result when printing a fine pattern. There will also be a possibility of short-circuiting.

Furthermore, the amount of sagging after printing depends only on the viscosity characteristics (the flowability amount of a paste kept under a stress of 10 Pa), and not on the constitution or the like of a paste. Therefore, there is no limitation to the constitution of the paste.

Next, the present invention will be explained in more detail based on the examples.

EXAMPLE 1

Pastes having compositions shown in Tables 1 and 2 were prepared using a three-roll mill and were used as pastes for forming patterns.

The viscosities at the shear rates of 4 sec$^{-1}$ and 10 sec$^{-1}$ were measured for each of the pastes (samples). The results are shown in Tables 1 and 2.

TABLE 1

| Sample No. | Type of inorganic powder | Type of Resin | Inorganic powder/ organic material (weight ratio) | Additive | Amount of additive (%) | Viscosity at 4 sec$^{-1}$ (Pa · sec) | Amount of blurring (μm) | Viscosity at 10 sec$^{-1}$ (Pa · sec) | Line breakage | State of printed line |
|---|---|---|---|---|---|---|---|---|---|---|
| 1 | Glass | Acrylic | 76.3/22.9 | Pigment Dispersant | 0.6 0.1 | 53 | 33 | 47 | Not found | Good |
| 2 | Glass | Acrylic | 76.3/21.3 | Pigment | 2.4 | 55 | 35 | 33 | Not found | Good |
| 3 | Glass | Acrylic | 69.5/29.7 | Pigment | 0.7 | 68 | 24 | 52 | Not found | Good |
| 4 | Glass | Acrylic | 68.0/30.4 | Pigment Dispersant | 0.5 1.1 | 40 | 28 | 31 | Not found | Good |
| 5 | Glass | Ethyl cellulose | 74.2/23.4 | Pigment | 2.5 | 326 | 11 | 210 | Not found | Good |
| 6 | Glass | Ethyl cellulose | 71.0/26.6 | Pigment | 2.4 | 205 | 20 | 131 | Not found | Good |

TABLE 1-continued

| Sample No. | Type of inorganic powder | Type of Resin | Inorganic powder/ organic material (weight ratio) | Additive | Amount of additive (%) | Viscosity at 4 sec$^{-1}$ (Pa · sec) | Amount of blurring ($\mu$m) | Viscosity at 10 sec$^{-1}$ (Pa · sec) | Line breakage | State of printed line |
|---|---|---|---|---|---|---|---|---|---|---|
| 7 | Copper powder | Ethyl cellulose + Alkyd | 85.4/14.7 | — | — | 184 | 26 | 137 | Not found | Good |
| 8 | Silver powder A | Ethyl cellulose | 88.0/12.0 | — | — | 84 | 33 | 73 | Not found | Good |
| 9 | Silver powder A | Ethyl cellulose + Alkyd | 81.0/15.2 | Dispersant Thixotropic agent | 2 1.8 | 61 | 34 | 27 | Not found | Good |
| 10 | Silver powder A | Ethyl cellulose | 86.2/13.8 | — | — | 195 | 24 | 148 | Not found | Good |

TABLE 2

| Sample No. | Type of inorganic powder | Type of Resin | Inorganic powder/ organic material (weight ratio) | Additive | Amount of additive (%) | Viscosity at 4 sec$^{-1}$ (Pa · sec) | Amount of blurring ($\mu$m) | Viscosity at 10 sec$^{-1}$ (Pa · sec) | Line breakage | State of printed line |
|---|---|---|---|---|---|---|---|---|---|---|
| 11 | Silver powder A | Ethyl cellulose + Alkyd | 82.3/12.4 | Thixotropic agent | 5.2 | 100 | 26 | 62 | Not found | Good |
| 12 | Silver powder A | Acrylic | 88.9/11.1 | — | — | 215 | 7 | 165 | Not found | Good |
| 13 | Silver powder A | Acrylic | 87.7/12.3 | — | — | 143 | 15 | 116 | Not found | Good |
| 14 | Silver powder C | Ethyl cellulose + Alkyd | 88.8/11.2 | — | — | 157 | 9 | 92 | Not found | Good |
| 15 | Glass | Acrylic | 65.7/33.6 | Pigment | 0.7 | 17 | >50 | 12 | Not found | Short circuit |
| 16 | Silver powder A | Ethyl cellulose + Alkyd | 86.9/13.1 | — | — | 38 | 50 | 35 | Not found | Short circuit |
| 17 | Glass | Ethyl cellulose | 78.0/19.4 | Pigment | 2.6 | 671 | 0 | 432 | Found | Line breakage |
| 18 | Silver powder A | Ethyl cellulose | 88.2/11.8 | — | — | 477 | 57 | 356 | Found | Line breakage |
| 19 | Silver powder A | Ethyl cellulose | 86.6/13.4 | — | — | 292 | 11 | 213 | Found | Line breakage |
| 20 | Silver powder B | Ethyl cellulose | 88.6/11.4 | — | — | 332 | — | 343 | Found | Line breakage |

The viscosities at the shear rates of 4 sec$^{-1}$ and 10 sec$^{-1}$ in Tables 1 and 2 were determined using a RHEOMETER CSL100 manufactured by Carri-Med, Inc.

The average particle diameters ($D_{50}$) of the glass, copper powder, silver powder A, silver powder B and silver powder C which were used as shown in Tables 1 and 2 are as follows:

$D_{50}$ (glass)=2.2 $\mu$m;

$D_{50}$ (copper powder)=1.6 $\mu$m;

$D_{50}$ (silver powder A)=4.6 $\mu$m;

$D_{50}$ (silver powder B)=1.8 $\mu$m; and $D_{50}$ (silver powder C)=0.27 $\mu$m.

Next, the prepared pastes were subjected to screen printing applied on to an aluminum substrate with a 300 mesh pattern, and the amount of blurring at the step of paste filling/transferring and the generation of line breakage were investigated.

The printing conditions were as follows:

| (1) Squeegee attack angle | 70°; |
|---|---|
| (2) printing speed | 50 mm/sec; and |
| (3) Squeegee pressing pressure | 7.8 N. |

Then, the printing precision (to see whether a high precision printing was feasible) of the obtained printed pattern (lines) was evaluated by examining whether short-circuiting and line breakage occurred on the lines with the line width/space=50 $\mu$m. The results are also shown in Tables 1 and 2.

As shown in Table 2, for the pastes of Sample Nos. 15 and 16 having viscosities of less than 40 Pa·sec at a shear rate of 4 sec$^{-1}$, the amounts of blurring were large at the step of paste filling/transferring and short-circuited lines were also observed. Accordingly, a fine and high-precision printing was not possible.

With the pastes of Sample Nos. 17 through to 20 having viscosities of more than 210 Pa·sec at a shear rate of 10 sec$^{-1}$, line breakage occurred. Accordingly, it was not possible to print a fine pattern.

On the other hand, with the pastes of Sample Nos. 1 through to 14 in Tables 1 and 2, the amounts of blurring were small at the step of paste filling/transferring and no line breakage was observed. Accordingly, it was possible to print a fine pattern precisely.

EXAMPLE 2

Pastes comprising the solid components having average diameters ($D_{50}$) as shown in table 3 were prepared using a three-roll mill and were used as screen printing pastes for forming patterns.

On the other hand, no line breakage was observed with the pastes of Sample Nos. 31 through to 34 comprising solid components having average diameters ($D_{50}$) of less than 10 µm.

EXAMPLE 3

Pastes having compositions shown in Table 4 were prepared using a three-roll mill and were used as screen printing pastes for forming patterns.

Then the flowability amounts of the pastes kept under a stress of 10 Pa for two minutes were determined on each of the prepared screen printing pastes (samples). The results are shown in Table 4.

TABLE 4

| Sample No. | Type of inorganic powder | Type of resin | Inorganic powder/ organic material (weight ratio) | Additive | Amount of additive (%) | Flowability amount (rad) | Amount of sagging (µm) |
|---|---|---|---|---|---|---|---|
| 41 | Glass | Acrylic | 76.4/23.0 | Pigment | 0.6 | 0.0003 | 1 |
| 42 | Glass | Acrylic | 69.5/29.7 | Pigment | 0.7 | 0.0080 | 15 |
| 43 | Glass | Acrylic | 68.0/30.4 | Pigment Dispersant | 0.5 1.1 | 0.0207 | >22 (Short circuit) |
| 44 | Glass | Ethyl cellulose | 74.2/23.4 | Pigment | 2.5 | 0.0110 | 20 |
| 45 | Glass | Ethyl cellulose | 71.0/26.6 | Pigment | 2.4 | 0.0159 | >30 (Short circuit) |
| 46 | Copper powder | Ethyl cellulose + Alkyd | 85.4/14.7 | — | — | 0.0200 | >24 (Short circuit) |
| 47 | Silver powder A | Ethyl cellulose | 88.2/11.8 | — | — | 0.0017 | 7 |
| 48 | Silver powder A | Ethyl cellulose + Alkyd | 81.0/15.2 | Dispersant Thixotropic agent | 2.0 1.8 | 0.0014 | 6 |
| 49 | Silver powder A | Ethyl cellulose | 86.6/13.4 | — | — | 0.0082 | 18 |
| 50 | Siler powder A | Ethyl cellulose | 86.2/13.8 | — | — | 0.0120 | 26 |
| 51 | Silver powder A | Ethyl cellulose + Alkyd | 82.3/12.4 | Thixotropic agent | 5.2 | 0.0023 | 17 |
| 52 | Silver powder C | Ethyl cellulose + Alkyd | 88.8/11.2 | — | — | 0.0004 | 5 |

TABLE 3

| Sample No. | Average diameter of solid components ($D_{50}$) | Viscosity at 10 sec$^{-1}$ | Line breakage |
|---|---|---|---|
| 31 | 4.6 | 116 | Not found |
| 32 | 5.0 | 10 | Not found |
| 33 | 8.0 | 12 | Not found |
| 34 | 9.9 | 11 | Not found |
| 35 | 10.2 | 10 | Found |

Then the printing precisions (to see whether a high precision printing was feasible) of printed patterns obtained by using the prepared screen printing pastes were evaluated by examining whether there was line breakage or not on the 50 µm-wide lines. The results are also shown in Table 3.

It is noted that the paste of Sample No. 35 in Table 3 comprised solid components having an average particle diameter ($D_{50}$) of not less than 10 µm.

As shown in Table 3, using the paste of Sample No. 35 comprising solid components having an average particle diameter ($D_{50}$) of 10.2 µm, line breakage was partly observed even when the viscosity at a shear rate of 10 sec$^{-1}$ was not more than 210 Pa·sec. Therefore, it is necessary to take the particle size of the solid components into consideration when a printing pattern with an especially narrow line width (as narrow as about 50 µm or less) is formed.

The flowability amounts shown in Table 4 were amounts of displacement determined by using a RHEOMETER CSL100 manufactured by Carri-Med, Inc. and a 2 cm long×1° cone, which were represented as the rotational angles of the cone when a stress of 10 Pa was applied to the pastes for two minutes.

The average particle diameters ($D_{50}$) of the glass, copper powder, silver powder A and silver powder C which were used as shown in Table 4 are as follows:

$D_{50}$ (glass)=2.2 µm;
$D_{50}$ (copper powder)=1.6 µm;
$D_{50}$ (silver powder A)=4.6 µm; and
$D_{50}$ (silver powder C)=0.27 µm.

The prepared pastes were subjected to screen printing applied on to an aluminum substrate with a 300 mesh pattern and the amounts of sagging after printing were investigated. The printing conditions were as follows:

| | |
|---|---|
| (1) Squeegee attack angle | 70°; |
| (2) printing speed | 50 mm/sec; and |
| (3) Squeegee pressing pressure | 7.8 N. |

Then the amounts of sagging of the obtained printed pattern (50 µm-wide lines) were evaluated. The results are also shown in Table 4.

As shown in Table 4, there is a tendency for the amount of sagging to be larger, the larger was the flowability amount of the paste when a stress of 10 Pa was applied to the paste for two minutes. For the pastes of Sample No. 43 (with a flowability amount of 0.0207 rad), Sample No. 45 (with a flowability amount of 0.0159 rad), Sample No. 46 (with a flowability amount of 0.0200 rad) and Sample No. 50 (with a flowability amount of 0.0120 rad), all of which had flowability amounts exceeding about 0.011 rad, the amounts of sagging were more than 20 μm, and it was difficult to print a fine line precisely.

On the other hand, when a sample had viscosity characteristics wherein the flowability amount of the paste was not more than about 0.011 rad when a stress of 10 Pa was applied to the paste for two minutes, the amount of sagging was not more than 20 μm and it was possible to print a fine line precisely.

It is noted that the present invention is not limited to the above-described examples, and various applications and modifications can be included regarding the specific values of the viscosity at the shear rate of 4 sec$^{-1}$ and at the shear rate of 10 sec$^{-1}$ and the methods for regulating the viscosity values, as well as the values of the flowability amount of the paste kept under a stress of 10 Pa for two minutes and the methods for regulating the flowability amount, as long as they are within the gist of the present invention.

Since the screen printing paste according to the present invention has a viscosity of not less than about 40 Pa·sec at a shear rate of 4 sec$^{-1}$ and a viscosity of not more than about 210 Pa·sec at a shear rate of 10 sec$^{-1}$, it is possible to prevent blurring of the paste and transfer of the paste to the rear of the screen printing plate at the step of paste filling/transferring. It is also possible to print a fine line without fail by screen printing without causing line breakage since the flowability of the paste is good at the time of transferring. Therefore, it is possible to print a fine pattern with a high precision by using a screen printing paste according to the present invention.

It was also made possible to improve the characteristics to fill the paste into the screen openings when the average diameter ($D_{50}$) of the solid components contained in the paste was less than about 10 μm. Accordingly, it was possible to prevent a line from breaking, which was related to the particle size of the solid components, and therefore it was possible to print a fine pattern precisely. The present invention thus becomes more effective.

Furthermore, by setting the flowability amount of the paste to be not less than about 0 rad and not more than about 0.011 rad when a stress of 10 Pa is applied to the paste for two minutes, blurring due to sagging of the paste can be restricted, and it is possible to print a planned pattern precisely. Furthermore, it is possible to prevent lines from short-circuiting due to sagging by providing such viscosity characteristics.

According to the screen printing method of the present invention, it is possible to form a fine printed pattern excellent in shape precision since the screen printing is carried out by using the screen printing paste according to the present invention.

Furthermore, by conducting screen printing using the screen printing paste according to the present invention, it is possible to form a printed pattern containing a fine line pattern with a line width of not more than about 100 μm, without fail and precisely, which is not necessarily easy when a conventional paste is used.

Furthermore, the baked thick film body according to the present invention is formed by baking a printed pattern obtained from the screen printing paste according to the present invention, and accordingly a high shape precision can be realized even when the line width is as fine as about 100 μm or less, or even about 50 μm or less.

What is claimed is:

1. A screen printing method comprising printing a line pattern with a line width of not more than about 100 μm by applying a screen printing paste to an object to be printed using a screen printing plate so as to realize said pattern,
    wherein said screen printing paste comprises a solid component and a vehicle, the paste viscosity at a shear rate of 4 sec$^{-1}$ is not less than about 40 Pa·sec, the paste viscosity at a shear rate of 10 sec$^{-1}$ is not more than about 210 Pa·sec, and the flowability of the paste is not less than about 0 rad and not more than about 0.011 rad, wherein rad is the rotational angle of a 2 cm long×1° cone when a stress of a 10 Pa is applied to the paste using a Rheometer CSL1100 apparatus for two minutes.

2. A screen printing method according to claim 1, wherein the average particle diameter ($D_{50}$) of the solid components contained in the paste is less than about 10 μm.

3. A screen printing method according to claim 2, wherein the pattern realized has a line width of not more than about 50 μm.

4. A screen printing method according to claim 3, wherein the solid component of the screen printing paste comprises glass powder, copper powder or silver powder.

5. A screen printing method according to claim 1, wherein the average particle diameter ($D_{50}$) of the solid components contained in the paste is less than about 5 μm.

6. A screen printing method according to claim 5, wherein the pattern realized has a line width of not more than about 50 μm.

7. A screen printing method according to claim 6, wherein the solid component of the screen printing paste comprises glass powder, copper powder or silver powder.

8. A screen printing method according to claim 1, wherein the pattern realized has a line width of not more than about 50 μm.

9. A screen printing method according to claim 1, wherein the solid component of the screen printing paste comprises glass powder, copper powder or silver powder.

* * * * *